United States Patent
Comita et al.

[19]

[11] Patent Number: 6,042,654
[45] Date of Patent: Mar. 28, 2000

[54] METHOD OF CLEANING CVD COLD-WALL CHAMBER AND EXHAUST LINES

[75] Inventors: Paul B. Comita, Menlo Park; Hali J. L. Forstner, Redwood City; Rekha Ranganathan, Sunnyvale, all of Calif.

[73] Assignee: Applied Materials, Inc., Santa Clara, Calif.

[21] Appl. No.: 09/006,463

[22] Filed: Jan. 13, 1998

[51] Int. Cl.$^7$ .............................. C03C 23/00; B08B 5/04
[52] U.S. Cl. .................................... 134/2; 134/21
[58] Field of Search ............................. 134/2, 1, 1.1, 21, 134/19; 156/345, 643; 438/10, 710

[56] References Cited

U.S. PATENT DOCUMENTS

| | | | |
|---|---|---|---|
| 5,207,836 | 5/1993 | Chang | 134/1 |
| 5,281,302 | 1/1994 | Gabric et al. | 156/643 |
| 5,356,478 | 10/1994 | Chen et al. | 134/1 |
| 5,616,208 | 4/1997 | Lee . | |
| 5,756,400 | 5/1998 | Ye et al. | 438/710 |
| 5,788,778 | 8/1998 | Shang et al. | 134/1 |
| 5,788,799 | 8/1998 | Steger et al. | 156/345 |
| 5,817,534 | 10/1998 | Ye et al. | 438/10 |
| 5,843,239 | 12/1998 | Shrotriya | 134/1.1 |
| 5,849,092 | 12/1998 | Xi et al. | 134/1.1 |

FOREIGN PATENT DOCUMENTS

| | | |
|---|---|---|
| 638923A2 | 5/1994 | European Pat. Off. . |
| 1246684 | 8/1963 | Germany . |
| 55-151339 | 11/1980 | Japan . |
| 63-204616 | 8/1988 | Japan . |
| 04303927 | 10/1992 | Japan . |
| 9715069 | 4/1997 | WIPO . |

Primary Examiner—Jill Warden
Assistant Examiner—Yolanda E. Wilkins
Attorney, Agent, or Firm—Blakely Sokoloff Taylor & Zafman

[57] ABSTRACT

A method of cleaning post deposition deposits from a processing chamber by providing a chlorine gas ($Cl_2$), forming chlorine radicals and reacting the chlorine radicals with the deposits.

39 Claims, 3 Drawing Sheets

| CHLORINE SOURCE GAS | CHAMBER PRESSURE | CHAMBER TEMPERATURE | DILUTION GAS | SILICON REMOVAL RATE |
|---|---|---|---|---|
| 20 slm Cl2 | 1.0 atm | 600 C | 2 slm He | 11μm/min. |
| 20 slm Cl2 | 1.0 atm | 600 C | 2 slm N2 | 4μm/min. |
| 20 slm Cl2 | 1.0 atm | 800 C | 2 slm He | 14μm/min. |
| 20 slm Cl2 | 1.0 atm | 800 C | 2 slm N2 | 18μm/min. |

FIG. 3

METHOD OF CLEANING CVD COLD-WALL CHAMBER AND EXHAUST LINES

BACKGROUND OF THE INVENTION

1. Field of the Invention

The present invention relates to the field of methods of cleaning a deposition chamber, and more specifically, to a method of removing silicon deposition by-products from internal chamber components and chamber exhaust lines while minimizing the effect on quartz chamber components.

2. Discussion of Related Art

In epitaxial or polysilicon deposition processes, silicon is typically deposited onto the wafer using processes such as chemical vapor deposition (CVD). A cross-sectional view of a typical single wafer, cold-wall CVD apparatus is shown in FIG. 1. The Figure shows a thermal reactor 100 for processing semiconductor substrates comprising, a double-dome reactor vessel 114 principally made of quartz that defines a reactor chamber 102, upper 118 and lower 104 quartz chamber liners, gas inlet manifold 106, a gas exhaust manifold 108, exhaust line 109, a radiant heating system 128, a drive assembly 126, a susceptor 124, a wafer 125, and a preheat ring 130. Susceptor 124 is larger than wafers processed. For example, a 200 mm wafer would be processed on a 240 mm susceptor. Additionally, but not shown, is that the gas inlet 106 is coupled to a gas supply of silicon, for example, dichlorosilane (DCS) or monosilane (SiH$_4$), or silane tetrachloride (SiCl$_4$), or trichlorosilane (TCS) and chlorine. Not shown in FIG. 1 is the pumping means coupled to exhaust line 109 for exhausting chamber. One of ordinary skill in the art will appreciate that chamber processes could be practiced at atmosphere pressure which would not require pumping means to provide chamber exhaust. One of ordinary skill will also appreciate that chamber processes could be performed at reduced pressures by utilizing a pumping means to lower chamber pressure. The illustrated reactor 100 does not use a plasma for either deposition or cleaning. The double dome rector vessel 114 includes a top dome 120 and a bottom dome 116, of quartz which are cooled by circulating cooling air around the outer surface of the quartz. Additionally, cooling water is circulated through the walls of the reactor such that a cold-wall, i.e., $T_{wall} < T_{process}$, is maintained. Typical dome temperatures range from about 100° C.–600° C. The drive assembly 126 is coupled to a motor (not shown) to rotate the susceptor 124 during the deposition process to enhance coating uniformity of the wafer 125 supported on top of the susceptor 124. Temperature measured at the susceptor is commonly used and referred to as process temperature, chamber temperature, deposition temperature or susceptor temperature.

The cold-wall is an important feature of the single wafer system since it reduces the deposition of semiconductor materials on the interior surface of the upper 120 and lower 116 quartz domes.

After repeated deposition processes are conducted in chamber 102, top surfaces of the circumferential edge of the susceptor 124 and the preheat ring 130 are covered with a film of the deposited material. The susceptor 124 is usually constructed of a thin plate for low thermal mass and a surrounding rim for rigidity. The diameter of a susceptor in a typical reaction vessel is approximately 1.5 inches larger than the diameter of the wafers being processed. A typical susceptor diameter for 200 mm wafers, for example, would be about 240 mm. Even though other wafer diameters are processed such as 150 mm or 300 mm, the susceptor diameter is always larger than the wafer diameter. Thus, a circumferential area is therefore exposed to the depositing semiconductor material. The susceptor 124 is typically made of graphite and coated with a silicon carbide coating such that it can be heated up to the deposition temperature without significant contamination.

The preheat ring 130 substantially seals the gap between the susceptor 124 and the quartz liner 104 and 118 of the reactor vessel 102 to control the heat lost from the edge of the susceptor. The preheat ring 130 is made of graphite material coated with silicon carbide for absorbing energy from radiant heating system 128. A quartz preheat ring can also be used. The top surface 129 of preheat ring 130 is exposed to the deposition material and therefore accumulates a film of such material due to the fact that the ring is heated to the deposition temperature.

In this process, a reactant gas mixture including a silicon source (such as silane, disilane, dichlorosilane, trichlorosilane, or silicon tetrachloride) is heated and passed over the wafer to deposit silicon film on the wafer surface. In most instances, a carrier gas, such as hydrogen, is also injected into the processing chamber. It is well known that after a sufficient number of deposition processes, i.e., about 1–10 processes for most materials, a film of sufficient thickness in the range between 1–10 microns builds up on the susceptor and preheat ring. In some chambers H$_2$ or other gas provides positive pressure to the backside of the susceptor and preheat ring to prevent backside silicon deposition. If backside pressure or some other method of preventing backside deposition is not employed, unwanted deposits will form on the backside of the susceptor and preheat ring as well. These unwanted films, if not removed, can impede the heating efficiency of the graphite parts. Most chambers of the CVD cold-wall type consist of quartz domes that form the upper and lower chamber boundaries. The quartz walls are kept cool relative to the susceptor process temperature by providing cooling air across the outer dome surface. Thus, silicon formation on the quartz is reduced. However, deposits will form on the quartz domes which could interfere with radiant energy transmission from radiant lamp system 128. Just like the deposits on other chamber components, these deposits could also flake or peel over time becoming sources of contamination and disrupt the process integrity. After several deposition process cycles the accumulated, unwanted deposition must be removed from the chamber. The accumulated material silicon and silicon containing polymer- is essentially the same regardless of whether the deposition result is epitaxial, amorphous or polysilicon film.

These silicon accumulations are typically removed with hydrogen chloride (HCl). In this process, the chamber is heated from the wafer transfer temperature to a temperature of about 1200° C. Once the chamber reaches 1200° C., above the dissociation temperature of HCl gas, HCl is introduced into the chamber. As a result of the high temperature, the HCl dissociates into reactive hydrogen (H) and chlorine (Cl) which will react with the silicon byproducts. The Cl radicals also react with quartz process parts like the quartz dome and liner. Since deposition rate is proportional to temperature of the surface and the cooling air keeps the dome several hundred degrees cooler than the susceptor, the quartz dome accumulates deposits at a slower rate than they accumulate on the susceptor and preheat ring. Thus, the quartz components are usually coated to a much lesser degree than other chamber components and could be susceptible to damage from the chlorine radicals with energy levels beyond thermal reaction energy. Once the silicon accumulations have been removed, the HCl flow is stopped and the chamber once again cooled from clean temperature of about 1200° C. to a wafer transfer temperature. Although HCl removes silicon deposits from the chamber components, it does not remove them completely from the system. Instead, when the H/Cl/Si mixture reaches the relatively cooler exhaust line it condenses forming a chlorosilane polymer. This polymer accumulates in the exhaust line after each clean. Furthermore, below it's dissociation temperature, (1150° C.) HCl will not break up the polymer. Thus, any HCl that reaches the exhaust line will not remove the polymer but would likely contribute to polymer formation. In time, the exhaust line polymer build up is so significant that the chamber must be taken out of production and the exhaust line cleared.

Thus, what is desired is a method of removing silicon deposits from a cold-wall CVD silicon deposition reactor with a process that does not utilize high temperatures and the necessary thermal transients; can remove chamber deposits without harm to internal chamber components; and can react with and remove polymer residue in the chamber exhaust line.

SUMMARY OF THE INVENTION

The present invention discloses a method of cleaning a CVD cold-wall chamber and exhaust lines. In one embodiment of the present invention, a chlorine gas ($Cl_2$) is introduced into a chamber that has been previously used for silicon deposition. The chamber is maintained at a temperature and pressure which results in chlorine dissociation into radicals while also providing a sufficient density of chlorine radicals to clean chamber internal components without damage to quartz components. As a result of the chlorine dissociation and advantageous radical density selectivity, the chloride radicals react with and remove the by-products from internal components and exhaust lines.

In an alternative embodiment, chlorine gas ($Cl_2$) may be thermally decomposed into radicals of sufficient density to selectively remove by-products of polysilicon deposition from internal components and exhaust lines.

In another alternative embodiment, chlorine gas ($Cl_2$) may be thermally decomposed into radicals of sufficient density to selectively remove by-products of amorphous silicon deposition from internal components and exhaust lines.

In another alternative embodiment, chlorine gas ($Cl_2$) may be thermally decomposed into radicals of sufficient density to selectively remove by-products of epitaxial silicon deposition from internal components and exhaust lines.

In another alternative embodiment, a chlorine source gas may be thermally decomposed into chlorine radicals of sufficient density to selectively remove by-products of silicon deposition.

Things well known regarding CVD equipment features, chamber lines and processing have not been described in detail but can be appreciated by those of ordinary skill in the art.

BRIEF DESCRIPTION OF THE DRAWINGS

Other objects, features and advantages of the present invention will become apparent upon consideration of the specification and the drawings, in which:

FIG. 3 is a table showing silicon removal rates for different temperatures and dilution gases.

DETAILED DESCRIPTION OF THE PRESENT INVENTION

In the following description, numerous specific details such as silicon deposition techniques, quartz dome shape, lamp intensity and direction, collimator and reflector shape, chamber assembly and sealing methods have been omitted from the description in order not to preclude a thorough understanding of the present invention. Those skilled in the art will appreciate that the present invention may be practiced without these specific details. Although the present invention has been described for a single wafer cold-wall CVD reactor, variations in equipment and design can be made by one skilled in the art of CVD equipment and semiconductor wafer processing and are intended to be included herein.

The present invention discloses an improved method of utilizing chlorine radicals from thermally decomposed chlorine gas ($Cl_2$) for the removal of deposition by-products from the internal components and quartz walls of a cold-wall CVD chamber, and by-products from the exhaust lines.

Figure 1:
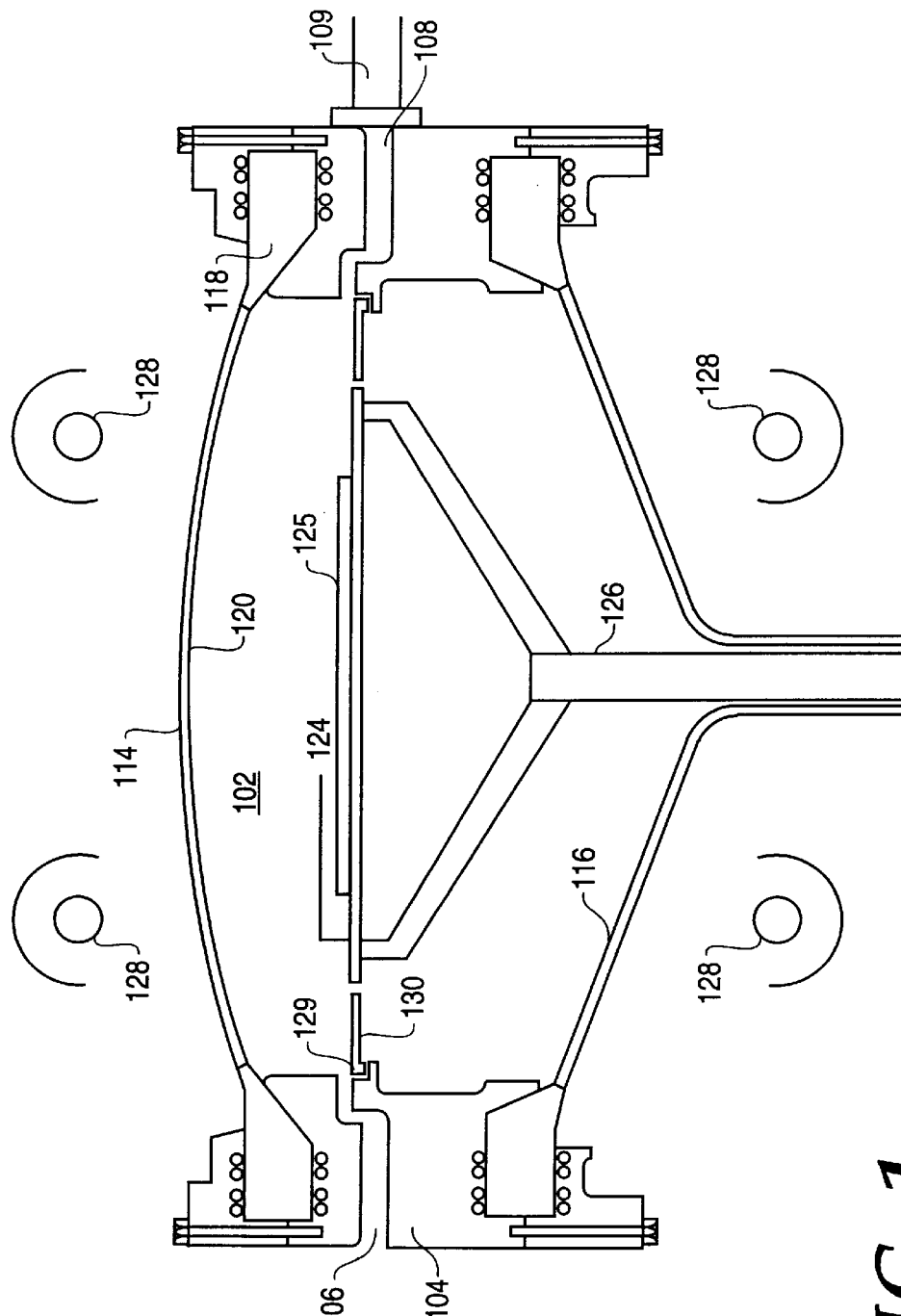
FIG. 1 is an illustration of a cross-sectional view of a conventional single wafer, cold-wall CVD apparatus.
Figure 2:
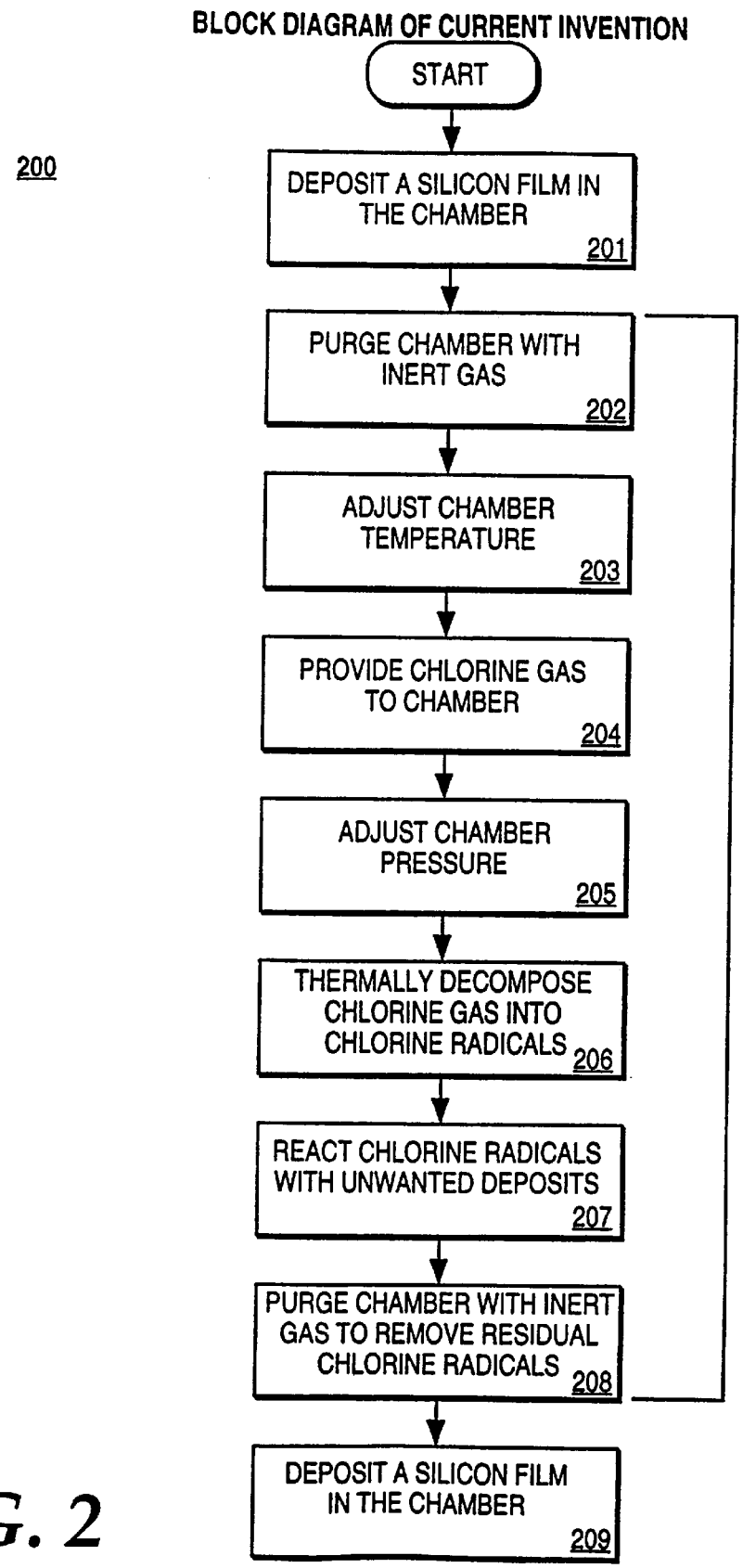
FIG. 2 is a block diagram which illustrates the method of the present invention.

The present invention can be carried out in a thermal reaction chamber as shown in FIG. 1. FIG. 2 contains block diagram 200 which sets forth the novel deposition and clean process of the present invention. The cleaning process of the present invention is set forth in blocks 202–208.

The first step of the present invention as set forth in block 201 is to deposit a silicon film in the chamber. The silicon film deposition occurs inside a thermal reaction chamber like the one shown in FIG. 1. A single substrate, like silicon wafer 125, is transferred into chamber 102 and placed on susceptor 124. Wafer transfer temperature typically ranges from about 500° C. to about 1050° C. Several factors affecting transfer temperature are wafer handler mechanics and metallurgy, anticipated wafer processing temperature, as well as overall system throughput concerns. A typical wafer transfer temperature is about 900° C. for epitaxial silicon processes while polysilicon could use a transfer temperature of about 650° C. Once the wafer 125 is in place, lamp sources 128 provide radiant heat which is transmitted through upper 120 and lower 116 quartz domes and are incident upon susceptor 124 and preheat ring 130. The susceptor 124 and preheat ring 130 are made of material opaque to the incident radiant energy which absorbs the radiant energy thereby increasing the temperature of susceptor 124 and preheat ring 130. Radiant energy from lamps 128 is increased until deposition temperature is reached. The radiant energy creates a region of sufficiently high temperature localized around wafer 125 to result in silicon formation. Additionally, since the susceptor 124 and preheat ring 130 are in the localized region of sufficiently high temperature, silicon is deposited on the upper surface of preheat ring 129 as well as the outer circumferential portion of susceptor 124 not covered by wafer 125. Deposition temperatures vary depending on desired film deposition. Typical atmospheric epitaxial silicon film is deposited at about 1100° C.

Once deposition temperature is obtained, a silicon source gas is introduced into reactor 102. There are a variety of silicon source gases available such as silane, disilane, dichlorosilane and trichlorosilane. The silicon source gas is provided via gas inlet 106, which is coupled to a silicon gas supply. One such silicon source gas is trichlorosilane (TCS). The silicon gas is flowed for variable lengths of time to achieve desired silicon film thickness on the upper surface of wafer 125. Even though cooling air is flowed across the outer surface of upper 120 and lower 116 quartz domes to keep them cool, i.e., within about 600° C. of susceptor temperature, some of the radiant energy from lamps 128 creates localized areas of sufficiently high temperature which results in some amount of silicon being deposited on the quartz domes 120 and 116. After obtaining desired film thickness on wafer 125, the silicon source gas is stopped and the chamber is cooled to the wafer transfer temperature. Wafer 125 is then removed from chamber 102.

Next, as set forth in block 202, the chamber is purged with an inert gas. Since hydrogen is commonly employed as a carrier gas in silicon deposition processes, the primary concern here is the removal of any residual hydrogen present in the chamber. Residual hydrogen is preferably removed to prevent the exothermic and potentially explosive formation of HCl when the chlorine cleaning gas is later introduced. The chamber can be purged with an inert gas such as but not limited to nitrogen, helium or argon. Purge time requirements vary depending on reactor volumes and inert gas flow rate. Representative purge time for a typical 200 mm single wafer CVD cold-wall reactor is about five seconds with helium flowed at 50 standard liters per minute (SLM).

The next step, as set forth in block 203, is to adjust chamber temperature to a temperature sufficient to dissociate the chlorine source gas into chlorine radicals. As before, temperature is adjusted by increasing or decreasing intensity of lamps 128 which forms localized regions of sufficiently high temperature which are generally susceptor 124 and preheat ring 130. Localized regions of sufficiently high temperature could also be formed near the surface of quartz domes 120 and 116 by reducing or eliminating cooling air flow. When using $Cl_2$ as a chlorine source gas, any localized temperature above 250° C. will result in chlorine dissociation. Additionally, chamber temperatures at the wafer transfer temperature or within about 75° C. of wafer transfer temperature provide adequate chloride radical density for cleaning as well as provide the added benefit of minimizing throughput impact by limiting thermal transients between wafer transfer temperature and cleaning temperature. When using chlorine gas $(Cl_2)$, advantageous chlorine radical densities can be obtained in the temperature range between 250° to 1050° C.

Next, as set forth in block 204, chlorine gas $(Cl_2)$ is provided to the chamber. The chlorine gas $(Cl_2)$ is provided to the chamber from some bulk supply in a manner similar to a method for providing other semiconductor process gases. The bulk supply is coupled to the chamber via gas inlet 106. The chlorine gas $(Cl_2)$ supplied for the cleaning process should be of sufficient purity so as not to introduce a source of contamination into the processing environment. Typical purity value when $Cl_2$ is used as a source gas is greater than 99.998% by volume. The amount of chlorine gas provided to the chamber is controlled by a flow control device. One such device is a mass flow controller (MFC). A representative flow rate for chlorine gas $(Cl_2)$ is 20 liters per minute although chlorine flow rates between 1 and 100 SLM have been used with advantageous results. Additionally, the chlorine source gas may be preferably diluted by flowing an inert gas such as argon, helium or nitrogen. A typical dilution flow rate for 20 SLM of chlorine gas $(Cl_2)$ is 2 SLM of helium.

The next step, as set forth in block 205, is to adjust chamber pressure. As the chamber environment is established with temperature and chlorine gas flow, the pressure must be monitored and adjusted accordingly. A typical pressure control device is a throttle valve located between the chamber exhaust and chamber process pump. Chamber pressure is monitored and the throttle valve opens and closes to regulate chamber pressure. Advantageous results have been achieved when chamber pressure is maintained at atmospheric pressure as well as at reduced chamber pressures as low as 10 Torr.

One skilled in the art will appreciate that blocks 203, 204, and 205 have been shown and described serially only for clarity in explaining the method of the present invention. In practicing the present invention, one skilled in the art could perform the steps described in blocks 203, 204, and 205 in a different order or nearly simultaneously.

The next step, as set forth in block 206, is to thermally decompose chlorine gas $(Cl_2)$ into chlorine radicals. The density of the chlorine radicals created by thermal decomposition, shown generally by the equation $Cl_2=2$ Cl radicals, can be calculated using an equilibrium approximation in the gas phase where, $k_f[Cl_2]=k_r[Cl]^2$, here $k_f$ is the forward rate constant for a unimolecular reaction and $k_r$ is the reverse rate constant for a bimolecular reaction. This analysis yields a chlorine radical density at 750° C. of about $7.7 \times 10^{12}$ atoms/cm$^3$ and at 1000° C. of about $3.2 \times 10^{13}$ atoms/cm$^3$ in the hot zone above the susceptor.

The equilibrium gas phase assumption is more accurate in the localized regions of high temperature where the temperature is closest to the susceptor temperature and the temperature used in the above calculation. As distance from the localized high temperature region increases, the radical density decreases dramatically. Thus, at 750° C. the highest radical density expected would be about $7.7 \times 10^{12}$ atoms/cm$^3$ near the susceptor and preheat ring while the density near cooled quartz walls would be several orders of magnitude less. If cooling air were reduced or eliminated from the quartz walls such that the temperature of the quartz is allowed to increase to the temperature of the susceptor and preheat ring, then radical densities of the same magnitude found at the susceptor and preheat ring could be formed near the quartz dome surface.

As set forth in the present invention, the chlorine radicals are only thermally activated and not ionized by RF energy, or any other ionizing sources. As such, there are only negligible ionized species present in the chamber. These ionized species, if present at all, contribute only marginally, if at all, to the cleaning process of the present invention. Also, since thermally activated radicals lack the high energy and directional component of ionized species generated by RF energy and only thermally activated radicals are used in the present invention, the sputtering effect caused by ionized species impinging on internal chamber components leading to damage and premature wear is not present. Minimization of the sputtering effect could also be illustrated by comparing thermally generated to plasma generated radical densities. As shown above, radicals formed by thermal decomposition of chlorine at 750° C. have a density in the localized region of high temperature of about $7.7 \times 10^{12}$ atoms/cm$^3$ while it is generally held that plasma generated radicals have a density of about $1 \times 10^{14}$ atoms/cm$^3$. Thus, the density of the thermally formed chlorine radicals is over one order of magnitude less than the density of the plasma generated chlorine radicals. Near the cooled quartz walls or other regions further away from the localized region of high temperature where the radical densities are lower, it is likely that the thermally activated radical density could be many orders of magnitude less than the plasma generated radical density. As a result, thermally activated radicals are of lower density than plasma generated radicals and are therefore less likely to damage internal components or result in increased component wear.

Although chlorine ($Cl_2$) will thermally decompose at 250° C. into chlorine radicals, other temperatures may be advantageous. Chamber temperatures within about 75° C. of wafer transfer temperature, typically ranging from about 500–1050° C., yield adequate radical densities to selectively clean the quartz domes and liners while minimizing the time needed to thermally transition the chamber temperature from the transfer temperature to the cleaning temperature. Other combinations of chamber temperature, pressure and chlorine gas flow rate will produce advantageous chlorine radical densities.

Next, as set forth in block 207, the chlorine radicals will react with and remove the silicon and silicon polymers. Some of the chlorine radicals will react with the silicon deposits on the susceptor 124, the preheat ring 130 and other internal components by attaching to the silicon to form SiCl and $SiCl_2$. Some of the SiCl will react with a chlorine radical and form $SiCl_2$ which will condense and polymerize when it reaches the relatively cooler temperature of the exhaust line. In much the same way, some of the chlorine radicals react with silicon deposits on the quartz domes 120 and 116 and quartz chamber liners 104 and 118. However, since the chlorine radicals were only thermally activated and not ionized, the silicon removal/SiCl formation process on the quartz components is much less likely to result in damage to the quartz. The thermally activated chlorine radicals have enough energy to dislodge the silicon deposit from the quartz and form SiCl. However, it is unlikely enough energy would remain to sputter the quartz. Thus, because of their lower energy and lack of ionized species, thermally activated chlorine radicals are sufficiently reactive to selectively remove silicon from quartz without damage to the quartz. Just like the silicon removal from other portions of the chamber, the silicon deposits removed by the chlorine radicals from the quartz components will also form SiCl and $SiCl_2$ and polymerize in the exhaust line.

However, this condensation and polymerization process is mitigated by the strong likelihood that some of the chlorine radicals will not have reacted with any of the deposits in the chamber. A portion of the exhaust line 109 coupled to exhaust port 108 is heated by the process chamber. As a result, a region of high temperature is created in the exhaust line 109. As these unreacted chlorine radicals exit the chamber and enter this region of the exhaust line heated by the chamber where the exhaust temperature remains above the dissociation temperature for chlorine, the unreacted chlorine radicals will react with and remove some silicon polymers which have formed in the exhaust line. Additionally, silicon deposit removal reaction rate and time for silicon removal will vary depending on deposit thickness, number of chlorine radicals released by thermal decomposition, chamber temperature and pressure and chlorine gas ($Cl_2$) flow rates.

Sample silicon removal times using chlorine gas ($Cl_2$) are set forth in Table 3. Some representative silicon removal rates at 1 atmosphere, 20 SLM chlorine $Cl_2$) diluted with 2 SLM He are: 11 $\mu$m/min. at 600° C. and 14 $\mu$um/min. at 800° C. At 1 atmosphere, 20 SLM chlorine ($Cl_2$) diluted with 2 SLM $N_2$, silicon was removed at: 4 $\mu$m/min. at 600° C. and 18 $\mu$/min. at 800° C. A representative clean time for about 2.0 $\mu$m of silicon deposition on a wafer is about 20 seconds at a chamber temperature of 740° C., atmospheric pressure and chlorine flow rate of 20 SLM diluted with 2 SLM of He.

Chlorine gas ($Cl_2$) flow times may vary. It is important to note that the chlorine radicals should be created for a sufficient time to ensure the removal of all unwanted silicon by-product while limiting unnecessary exposure of chamber components to chlorine radicals.

The next step of the present invention, set forth in block 208, is to purge the chamber with inert gas to remove residual chlorine radicals prior to resuming deposition processing. In this step, as with Block 202, the preferred intent is to avoid the combination of hydrogen and chlorine and the exothermic and potentially explosive formation of HCl. The potential combination exists since chlorine was just used as a cleaning gas and hydrogen is a commonly used carrier gas for silicon deposition processing. In order to alleviate this potential hazard, the chamber should be purged with an inert gas for sufficient time to remove any residual chlorine. Purge times will vary with inert gas flow rate and chamber volume. Typical purge cycle time for a 200 mm conventional single wafer cold-wall CVD reactor (shown in FIG. 1) would be about 5 seconds with an inert gas such as helium flowed at a rate of 50 SLM.

The final step of the present invention, block 209, is the resumption of the deposition process cycle where a silicon film is deposited in the chamber. The chamber temperature is adjusted to the wafer transfer temperature which is typically in the range between about 500° C. and about 1050° C. Once the wafer transfer temperature is attained, a wafer 125 will be placed on susceptor 124. Lamps 128 will provide radiant energy into chamber 102 until the chamber deposition temperature is reached. Deposition temperature varies depending on silicon film type. Typical epitaxial silicon deposition temperatures are about 1100° C. Once the deposition temperature is achieved, a silicon source gas is provided into chamber 102 via gas inlet 106. When the silicon source gas is exposed to the radiant energy of the preheat ring and the susceptor, silicon deposition occurs. Deposition rate varies upon chamber temperatures, silicon source gas, source gas flow rate and chamber pressure. Numerous silicon source gases are available such as monosilane, disilane, dichlorosilane, trichlorosilane or silicon tetrachloride. One such source gas is trichlorosilane (TCS). When flowed at 11 SLM in a chamber at 760 Torr and 1100° C., TCS forms epitaxial silicon. The deposition process results in film formation on the wafer 125 but also results in silicon deposition on preheat ring 129, outer circumference of susceptor 124, and to a lesser extent, because they are cooler, quartz components such as upper 120 and lower 116 domes and chamber liners 104 and 118. Silicon formation on the chamber components could have detrimental impact on process repeatability because coating on the domes interferes with radiant energy transmission and any flaking deposits would generate particles which ruin wafers and negatively impact device yield.

In an alternative embodiment of the present invention, other chlorine source gases are expected to demonstrate similar advantageous qualities of the present invention such as but not limited to the ability to dissociate into chlorine radicals at or near wafer transfer temperatures and to assist in the removal of chlorosilane polymers from the exhaust line. Chlorine source gases such as $SiCl_4$ and $ClF_3$ would be anticipated to provide similar benefits as described in the present invention and in much the same way as chlorine gas ($Cl_2$).

Thus, what is disclosed is a method of removing silicon and polymeric deposits from a cold-wall CVD silicon deposition reactor utilizing thermally generated chlorine radicals which minimize wear on quartz components and increase removal of exhaust line polymers.

We claim:

1. A method for cleaning a process chamber having post deposition deposits formed therein comprising the steps of:
   (a) providing $Cl_2$ gas into said processing chamber;
   (b) thermally decomposing said gas to form Cl radicals and reacting said Cl radicals with said deposits formed inside said process chamber on internal components from the group consisting of a susceptor, chamber liners, upper and lower domes, and preheat rings which are fabricated from quartz, SiC coated graphite or, stainless steel; and
   (c) removing the by products of said reaction.

2. The method of claim 1 where the density of said chlorine radicals is sufficient to selectively remove said deposits without damage to said internal components.

3. The method of claim 1 wherein said chlorine radicals have a density less than or equal to $3.2 \times 10^{13}$ atoms/cm$^3$.

4. A method of cleaning a process chamber having post deposition deposits formed therein comprising the steps of:
   (a) providing $Cl_2$ gas into said process chamber having post deposition deposits formed on internal process chamber components,
   (b) thermally decomposing said $Cl_2$ gas into Cl radicals,
   (c) reacting said formed Cl radicals with said internal process chamber deposits; and
   (d) removing the by products of said reaction.

5. The method of claim 4 where deposits have formed within the process chamber comprising chamber walls, susceptor, chamber liner, upper chamber dome, and preheat rings which circumscribe the susceptor which are fabricated from materials selected from the group consisting of quartz, graphite and stainless steel.

6. The method of claim 4 wherein said thermally formed Cl radicals react with said deposits in a region of the exhaust line heated by said chamber.

7. The method of claim 4 further comprising the step of forming an epitaxial silicon layer in said chamber prior to providing said $Cl_2$ gas into said chamber and wherein said silicon polymeric or $[SiH_xCl_y]_n$ deposits were formed from the epitaxial silicon deposition within said process chamber.

8. The method of claim 4 further comprising the step of forming an amorphous silicon layer in said chamber prior to providing said $Cl_2$ gas into said chamber and wherein said silicon polymeric or $[SiH_xCl_y]_n$ deposits were formed from the amorphous silicon deposition within said process chamber.

9. The method of claim 4 further comprising the step of forming an polysilicon layer in said chamber prior to providing said $Cl_2$ gas into said chamber and wherein said silicon polymeric or $[SiH_xCl_y]_n$ deposits were formed from the polysilicon deposition within said process chamber.

10. The method of claim 4 where the $Cl_2$ gas is caused to flow into said process chamber at a rate greater than 1 SLM but less than 100 SLM.

11. The method of claim 10 where the $Cl_2$ gas is greater than 99.998% purity such that said $Cl_2$ gas is not a contaminant source for subsequent deposition of epitaxial, amorphous or polysilicon film.

12. The method of claim 4 wherein said $Cl_2$ gas is heated to a temperature in the range greater than 250° C. and less than 1125° C. to thermally decompose $Cl_2$ gas into said Cl radicals.

13. The method of claim 4 where the density of said chlorine radicals is sufficient to selectively remove said deposits with minimal damage to said internal components.

14. The method of claim 4 wherein said chlorine radicals have a density less than or equal to $3.2 \times 10^{13}$ atoms/cm$^3$.

15. The method of claim 4 wherein the density of said Cl radicals is about $7.7 \times 10^{12}$ atoms/cm$^3$.

16. A method for cleaning a process chamber having deposits formed from hydrogen, silicon and chlorine, generally $[SiH_xCl_y]n$, comprising the steps of:
   (a) providing a deposition process gas comprising of a silicon source gas and $H_2$ carrier gas into said process chamber to form a silicon film within said process chamber wherein said silicon film forms deposits on internal process chamber components;
   (b) providing an inert gas into said chamber to remove residual $H_2$;
   (c) providing $Cl_2$ gas into said process chamber;
   (d) thermally decomposing said $Cl_2$ gas into Cl radicals;
   (e) reacting said formed Cl radicals with said deposits formed on internal process chamber components; and
   (f) providing an inert gas into said chamber to remove residual Cl gases, thereby removing the by products of said reaction.

17. The method of claim 16 wherein said $Cl_2$ gas is raised to a temperature between 250° C. and 1125° C. to decompose said $Cl_2$ gas into Cl radicals.

18. The method of claim 16 wherein said $Cl_2$ gas is raised to a temperature between within 75° C. of wafer transfer temperature.

19. The method of claim 16 where the pressure within said processing chamber is greater than 10 Torr but less than or equal to atmospheric pressure.

20. The method of claim 16 where the $Cl_2$ gas is caused to flow into said process chamber at a rate greater than 1 SLM but less than 100 SLM.

21. The method of claim 16 where the density of said chlorine radicals is sufficient to selectively remove said deposits without damage to said internal components.

22. The method of claim 16 where the density of said chlorine radicals is less than or equal to $3.2 \times 10^{13}$ atoms/cm$^3$.

23. The method of claim 16 where said silicon deposits were the result of epitaxial silicon deposition within said process chamber.

24. The method of claim 16 where silicon deposits were the result of amorphous silicon deposition within said process chamber.

25. The method of claim 16 where said silicon deposits were the result of polysilicon deposition within said process chamber.

26. A method for cleaning a process chamber comprising of the steps of:
   (a) providing process chamber comprising a susceptor, preheat rings, liner, and quartz dome;
   (b) forming deposits on process chamber components as a result of silicon deposition;
   (c) providing $Cl_2$ gas into said process chamber;
   (d) thermally decomposing said $Cl_2$ gas into chlorine radicals; and
   (e) reacting said formed chlorine radicals with said deposits.
   (f) removing the product of said reaction.

27. The method of claim 26 where the temperature of said process chamber is greater than 250° C. but less than 1125° C.

28. The method of claim 26 where the pressure within said processing chamber is greater than 10 Torr but less than or equal to atmospheric pressure.

29. The method of claim 26 where the density of said chlorine radicals is sufficient to selectively remove said deposits without damage to said internal components.

30. The method of claim 26 where the density of said chlorine radicals is less than or equal to $3.2 \times 10^{13}$ atoms/cm$^3$.

31. The method of claim 26 where said deposits were the result of epitaxial silicon deposition within said process chamber.

32. The method of claim 26 further wherein the deposits were the result of polysilicon deposition within said process chamber.

33. The method of claim 26 wherein the deposits were the result of amorphous silicon deposition within said process chamber.

34. A method for cleaning a process chamber having post deposition deposits formed therein comprising the steps of:
(a) providing a chlorine source gas into said processing chamber having post deposition deposits formed on internal chamber components;
(b) providing a chamber temperature about or below 1125° C.;
(c) thermally decomposing said chlorine source gas to form chlorine radicals and reacting said chlorine radicals with said deposits formed on internal chamber components; and
(d) removing the by products of said reaction.

35. The method of claim 34 wherein said chlorine source gas is $Cl_2$.

36. The method of claim 34 wherein said chlorine source gas is $ClF_3$.

37. The method of claim 34 wherein said chlorine source gas is $SiCl_4$.

38. The method of claim 34 wherein said chlorine radicals have a density less than or equal to $3.2 \times 10^{13}$ atoms/cm$^3$.

39. The method of claim 34 wherein said chlorine radicals have a density of about $7.7 \times 10^{12}$ atoms/cm$^3$.

* * * * *